United States Patent
Huang (10) Patent No.: US 6,881,533 B2
(45) Date of Patent: Apr. 19, 2005

(54) FLEXOGRAPHIC PRINTING PLATE WITH INK-REPELLENT NON-IMAGE AREAS

(75) Inventor: Jianbing Huang, Trumbull, CT (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 136 days.

(21) Appl. No.: 10/368,209

(22) Filed: Feb. 18, 2003

(65) Prior Publication Data

US 2004/0161705 A1 Aug. 19, 2004

(51) Int. Cl.⁷ .......................... G03F 7/038; G03F 7/095
(52) U.S. Cl. ..................................... 430/306; 430/309
(58) Field of Search .................................. 430/306, 309

(56) References Cited

U.S. PATENT DOCUMENTS

| | | |
|---|---|---|
| 3,512,971 A | 5/1970 | Floss et al. |
| 3,762,325 A | * 10/1973 | Hallman et al. ............. 430/306 |
| 4,135,960 A | 1/1979 | Shuppert et al. |
| 4,197,125 A | 4/1980 | Ohkawa et al. |
| 4,410,562 A | 10/1983 | Nemoto et al. |
| 4,427,759 A | 1/1984 | Gruetzmacher et al. |
| 4,460,675 A | 7/1984 | Gruetzmacher et al. |
| 4,622,088 A | 11/1986 | Min |
| 4,889,793 A | 12/1989 | Taniguchi et al. |
| 4,927,723 A | 5/1990 | Cusdin |
| 4,927,739 A | 5/1990 | Taniguchi et al. |
| 4,956,252 A | 9/1990 | Fryd et al. |
| 4,957,850 A | 9/1990 | Kusuda et al. |
| 5,061,598 A | 10/1991 | Abe et al. |
| 5,061,606 A | 10/1991 | Telser et al. |
| 5,148,746 A | 9/1992 | Fuller et al. |
| 5,204,222 A | 4/1993 | Gersdorf et al. |
| 5,232,813 A | 8/1993 | Okuno et al. |
| 5,260,167 A | 11/1993 | Sasa et al. |
| 5,281,510 A | 1/1994 | Sakurai et al. |
| 5,362,605 A | 11/1994 | Mirle et al. |

(Continued)

FOREIGN PATENT DOCUMENTS

| | | |
|---|---|---|
| EP | 452656 | 3/1991 |
| EP | 624825 | 4/1994 |
| EP | 709438 | 10/1995 |
| EP | 828195 | 9/1997 |
| WO | WO 01/95031 | 12/2001 |

OTHER PUBLICATIONS

U.S. Appl. No. 10/368,262, filed Feb. 18, 2003, Huang.

*Primary Examiner*—Cynthia Hamilton
(74) *Attorney, Agent, or Firm*—Faegre & Benson LLP (57) ABSTRACT

A method for making a relief printing plate from an imageable lithographic printing plate precursor. The relief printing plate has ink-receptive cured areas, and ink-repellent non-image areas. The method comprises the steps of: a) imaging the lithographic printing plate precursor to produce ink-receptive image areas and ink-repellent non-image areas; b) applying a curable composition to form a coating on ink-receptive image areas; and c) curing the coating to produce ink-receptive cured areas. The method of another embodiment further comprises the steps of: d) applying a curable composition to form a coating on ink-receptive cured areas; e) curing the coating on the cured areas; and f) repeating steps d) and e) to attain a desired relief depth for the ink-receptive cured areas. In the practice of an embodiment of the invention, a modified rotary printing press may be employed to make a relief printing plate from a lithographic printing plate.

39 Claims, 3 Drawing Sheets

U.S. PATENT DOCUMENTS

| | | |
|---|---|---|
| 5,379,698 A | 1/1995 | Nowak et al. |
| 5,384,357 A | 1/1995 | Levinson et al. |
| 5,484,684 A | 1/1996 | Telser et al. |
| 5,506,086 A | 4/1996 | Van Zoeren |
| 5,552,263 A | 9/1996 | Schober et al. |
| 5,607,814 A | 3/1997 | Fan et al. |
| 5,676,053 A | 10/1997 | Schafer |
| 5,705,310 A | 1/1998 | Van Zoeren |
| 5,707,773 A | 1/1998 | Grossman et al. |
| 5,719,009 A | 2/1998 | Fan |
| 5,735,983 A | 4/1998 | Goss et al. |
| 5,736,298 A | 4/1998 | Koshimura et al. |
| 5,786,125 A | 7/1998 | Tsuchiya et al. |
| 5,798,202 A | 8/1998 | Cushner et al. |
| 5,859,134 A | 1/1999 | Reimers |
| 5,888,701 A | 3/1999 | Fan |
| 5,902,714 A | 5/1999 | Reimers |
| 5,919,600 A | 7/1999 | Huang et al. |
| 5,955,238 A | 9/1999 | Yokoya et al. |
| 6,017,678 A | 1/2000 | Gries et al. |
| 6,020,108 A | 2/2000 | Goffing et al. |
| 6,037,102 A | 3/2000 | Loerzer et al. |
| 6,045,963 A | 4/2000 | Huang et al. |
| 6,063,546 A | 5/2000 | Gelbart |
| 6,074,802 A | 6/2000 | Murata et al. |
| 6,090,529 A | 7/2000 | Gelbart |
| 6,130,026 A | 10/2000 | Bennett et al. |
| 6,159,658 A | 12/2000 | Tanaka et al. |
| 6,194,122 B1 | 2/2001 | Ichikawa et al. |
| 6,210,854 B1 | 4/2001 | Grossman et al. |
| 6,214,276 B1 | 4/2001 | Gelbart |
| 6,245,486 B1 | 6/2001 | Teng |
| 6,284,431 B1 | 9/2001 | Tanizaki et al. |
| 6,303,271 B1 | 10/2001 | Bennett et al. |
| 6,358,667 B1 | 3/2002 | Kellett |
| 6,358,668 B1 | 3/2002 | Leenders et al. |
| 6,413,697 B1 | 7/2002 | Melisaris et al. |
| 6,416,932 B1 | 7/2002 | Ray et al. |
| 2002/0048721 A1 | 4/2002 | Kamiya et al. |
| 2002/0123003 A1 | 9/2002 | Kannurpatti et al. |

* cited by examiner

FLEXOGRAPHIC PRINTING PLATE WITH INK-REPELLENT NON-IMAGE AREAS

TECHNICAL FIELD

The present invention relates to methods for making relief printing plates, such as flexographic printing plates, from imageable lithographic printing plate precursors. The relief printing plates have ink-receptive cured areas defining an image (i.e., "image areas"), and ink-repellent non-image areas. In the practice of an embodiment of the invention, a modified rotary printing press may be employed to make a relief printing plate from a lithographic printing plate.

Relief printing plates are used in both flexographic and letterpress processes for printing on a variety of media, particularly for media which are soft and easily deformable, such as paper or plastic packaging materials, cardboard or other corrugated stock, film, foil, and laminates. Relief printing plates generally consist of raised image areas and depressed non-image areas. During printing, ink is transferred only from the raised image areas to the print media.

Historically, relief printing plates such as flexographic printing plates were formed from vulcanized rubber. Rubber was favored because it is resistant to harsh solvents, it has good ink transfer characteristics, high elasticity, and high compressibility. Rubber printing elements were originally made by vulcanizing the rubber material in a suitable mold. More recently, rubber printing elements have been made by direct laser engraving.

Relief printing plates are now generally made from photosensitive elements that are specifically designed for that purpose. The photosensitive elements that are used to make relief printing plates typically include a support layer, and one or more photosensitive layers comprising a photocurable composition including a polymer or prepolymer. Ideally the support layer is made from a dimensionally stable material, such as polyester film or an aluminum sheet.

In making a relief printing plate from certain types of photosensitive elements, one side of the photosensitive layer is first exposed to an energy source (such as ultraviolet light) through the support to prepare a thin, uniform cured layer on the support side of the photosensitive layer. Then a masking device (such as a photographic negative) is placed over the photosensitive layer. The photosensitive element is then exposed to an energy source through the masking device, thereby causing exposed areas of the photocurable composition to harden, or cure. Unexposed and uncured portions of the photosensitive layer are then removed by a developing process, leaving the cured portions which define the relief printing surface.

Photosensitive elements comprising a top laser-ablatable mask layer have been reported. These types of plates may be made into relief printing plates without the use of a photographic negative or other separate masking device. Thus, "computer-to-plate" (CTP) processing may be achieved. In contrast to conventional methods that require a masking device, in a CTP method the preparation of a new masking device is not required when edits or modifications to the image are necessary. Modifications and edits to the image can be made on a computer, so that the CTP process advantageously saves time, labor and materials. Moreover, as compared with conventional masking devices such as photographic negatives, the photosensitive element has better dimensional stability, resulting in an improvement in reproducibility of the relief image and a corresponding improvement in printing quality.

Plates having an ablatable mask layer can be imaged by first imagewise exposing with laser radiation (generally under computer control) to selectively remove the mask layer in the exposed areas, and then overall exposing with an actinic radiation to cure the photosensitive layer in the unmasked areas. The remaining areas of the mask layer and the non-hardened portions of the photosensitive layer are then removed by one or more liquid development processes. Examples of such plates are described in U.S. Pat. No. 5,705,310 to Van Zoeren, U.S. Pat. No. 5,719,009 to Fan, U.S. Pat. No. 6,020,108 to Goffing, et al., and U.S. Pat. No. 6,037,102 to Loerzer, et al. While plates having a laser-ablatable mask layer allow direct imagewise exposure with a laser and do not require a separate masking device, the mask layer removal process is cumbersome and generates chemical waste. It would be desirable to reduce or eliminate such a liquid development process in the processing of a relief printing plate.

U.S. Pat. No. 4,410,562 to Nemoto, et al. reports a method for forming a cured resin coating having a desired pattern on the surface of a substrate. The method includes the steps of: applying a coating of a UV-curable resin to the surface of a substrate; precuring the coating; applying a printed layer in a predetermined pattern to the surface of the procured coating, using a light-insensitive, non-transparent printing ink; irradiating with UV light to cure the areas of the coating not covered by the printed layer; and removing the printed layer and the precured coating beneath the printed layer, to leave a cured resin coating, having a pattern complementary to the pattern of the printed layer, on the substrate. The reported method also requires removal of a portion of a photosensitive layer, and therefore wastes at least some of the UV-curable resin.

A stereolithographic technique for layer-by-layer buildup of a radiation-curable composition to yield a three-dimensional cured object is described in U.S. Pat. No. 6,413,697 to Melisaris, et al. An alternative stereolithographic approach is reported in U.S. Pat. No. 6,214,276 to Gelbart. However, stereolithographic techniques are slow, often require a large bath of a curable liquid composition, and require repeated iterations in which a laser or other radiation source is rasterized or moved to form a pattern.

SUMMARY OF THE INVENTION

In one embodiment, the present invention provides a method for making a relief printing plate from an imageable lithographic printing plate precursor, the method comprising the steps of: a) imaging the lithographic printing plate precursor to produce a lithographic printing plate having ink-receptive image areas and ink-repellent non-image areas; b) applying a first curable composition to the lithographic printing plate, to form a substantially uniform coating of the first curable composition on ink-receptive image areas; and c) curing the coating of the first curable composition to produce ink-receptive cured areas including a first cured layer.

The step of curing may be done by, for example, exposing the first curable composition to ultraviolet radiation or to a beam of electrons. In the practice of the method, the step of applying the first curable composition may include a "screen printing" technique. The method may further include applying a second curable composition to ink-receptive cured areas, and curing the second curable composition to produce ink-receptive cured areas including a second cured layer.

In a second embodiment, the invention provides a method for making a relief printing plate from an imageable lithographic printing plate precursor, the method comprising the steps of: a) imaging the lithographic printing plate precursor to produce a lithographic printing plate having ink-receptive image areas and ink-repellent non-image areas; b) applying a first curable composition to the lithographic printing plate, to form a substantially uniform coating of the first curable composition on ink-receptive image areas; c) curing the coating of the first curable composition to produce ink-receptive cured areas including a first cured layer; d) applying either the first curable composition or a second curable composition to the lithographic printing plate, to form a substantially uniform coating of the first or second curable composition on ink-receptive cured areas; e) curing the coating of the first or second curable composition on the cured layer; and f) repeating steps d) and e) to attain a desired relief depth for the ink-receptive cured areas of the cured layer.

This embodiment of the invention may be readily carried out in an automated fashion, such as by operating a rotary printing press adapted to carry out the steps of applying and curing the first or second curable compositions. Practice of the method allows a relief printing plate to be built up in a layer-by-layer fashion, and does not require a developing step in which a significant quantity of a photosensitive layer of a photosensitive element is removed. Furthermore, the method requires less material, since little or no curable composition is wasted.

DETAILED DESCRIPTION OF THE INVENTION

First Embodiment

In one embodiment, the present invention provides a method for making a relief printing plate from an imageable lithographic printing plate precursor, the method comprising the steps of: a) imaging the lithographic printing plate precursor to produce a lithographic printing plate having ink-receptive image areas and ink-repellent non-image areas, the ink-receptive image areas and ink-repellent non-image areas defining an image; b) applying a first curable composition to the lithographic printing plate, wherein the first curable composition wets ink-receptive image areas and does not wet ink-repellent non-image areas, to form a substantially uniform coating of the first curable composition on ink-receptive image areas; and c) curing the coating of the first curable composition to produce ink-receptive cured areas including a first cured layer, such that the ink-receptive cured areas and ink-repellent non-image areas define the image.

Imaging a Lithographic Printing Plate Precursor

In one step of the method, a lithographic printing plate precursor is imaged to produce a lithographic printing plate. As used herein, the term "lithographic printing plate" means an image-bearing planographic printing plate that has ink-receptive image areas and ink-repellent non-image areas. The phrase "image areas" is used herein to refer to individual halftone dots that make up an image on the printable surface of a lithographic printing plate. The phrase "non-image areas" is used herein to refer to areas on the printable surface of a lithographic printing plate that are not image areas.

A "lithographic printing plate precursor" is a non-image-bearing precursor that can be transformed into an image-bearing lithographic printing plate by suitable imaging and developing steps. A lithographic printing plate precursor generally includes a support and an imageable coating. In the practice of the present invention, suitable lithographic printing plate precursors include those that are intended for making wet printing plates (i.e., those that require a fount solution) and those that are intended for making waterless printing plates (i.e., those that do not require a fount solution). Both wet and waterless printing plates are widely known in the field.

The lithographic printing plate precursor includes an imageable coating. The imageable coating generally includes a radiation-sensitive composition that becomes either more soluble or less soluble in a developer upon exposure to radiation. In the practice of the invention, the imageable coating may be positive-working or negative-working. In the production of a lithographic printing plate, portions of the imageable coating are selectively exposed to radiation. After exposure, the imageable coating is generally developed to wash away the more soluble regions. The imageable coating that remains generally provides either ink-receptive areas or ink-repellent areas on the surface of the lithographic printing plate. Imageable coatings for lithographic printing plate precursors are widely known.

In printing plate precursors for wet printing plates, the support typically includes a hydrophilic surface, which is coated with the imageable coating. Generally, any material conventionally used as a support in a wet lithographic printing plate is suitable for the lithographic printing plate precursor used in the method. By way of example, a treated aluminum substrate is suitable as the support for the practice of the method. The surface of the aluminum substrate may be treated by metal finishing techniques known in the art including brush roughening, electrochemical roughening or electrograining, chemical roughening, anodizing, silicate sealing and the like. Aluminum substrates for lithographic printing plates are well-known in the field.

In printing plate precursors for waterless printing plates, the imageable coating typically includes a photosensitive layer and an ink-repellent layer (such as, for example, a silicone rubber layer or fluoropolymer layer) over the photosensitive layer and under any mask layer. After imagewise exposure the printing plate is developed. As a result of the developing process, the ink-repellent layer is removed from the non-hardened or solubilized areas of the photosensitive layer, and the ink-repellent layer remains in the hardened or non-solubilized areas of the photosensitive layer. During printing, ink adheres only to those areas of the printing plate not covered by the ink-repellent layer remaining after development. Thus the plate can be printed without the need to use a fount solution. In contrast to printing plate precursors for wet printing plates, the support for a waterless printing plate may have an oleophilic surface. Generally, any material conventionally used as a support in a waterless lithographic printing plate is suitable for the lithographic printing plate precursor used in the method.

Ink-repellent layers in waterless printing plates are generally provided by amphiphobic (i.e., having both hydrophobic and oleophobic character) materials such as silicone polymers or fluoropolymers. Suitable waterless printing plate precursors including a support, a photosensitive layer and a top silicone-based layer are reported, for example, in U.S. Pat. No. 5,061,598 to Abe, et al., U.S. Pat. No. 5,232,813 to Okuno, et al., U.S. Pat. No. 5,260,167 to Sasa, et al. U.S. Pat. No. 5,786,125 to Tsuchiya, et al., U.S. Pat.

No. 5,919,600 to Huang, et al., U.S. Pat. No. 5,955,238 to Yokoya, et al., U.S. Pat. No. 6,045,963 to Huang, et al., and U.S. Pat. No. 6,194,122 to Ichikawa, et al. Suitable waterless printing plate precursors including a support, a photosensitive layer and a top fluoropolymer-based layer are reported, for example, in U.S. Pat. No. 6,130,026 to Bennett, et al.

The relief printing plates produced by the methods of the present invention may be suitable, for example, for use in flexographic printing. To work with existing flexographic printing presses, the lithographic printing plate precursor may contain one or more ancillary layers that enhance functionality and performance of the resulting relief printing plate. For example, the precursor may include additional layers to improve interlayer adhesion, to reduce halation effects, to improve printing surface characteristics, and the like. Optional layers that may be added to modify the essential precursor construction include a protective layer laminated on top of a silicone layer, an adhesion promotion layer between a silicone layer and a photosensitive layer, or a primer layer between a photosensitive layer and the substrate.

For example, if the chosen support material does not have resilient properties typical of flexographic printing plates, such resilient properties may optionally be provided by an elastomeric primer layer coated on the support. Useful primer layer compositions may include those described in U.S. Pat. No. 5,061,598 to Abe, et al., U.S. Pat. No. 5,232,813 to Okuno, et al., and U.S. Pat. No. 5,260,167 to Sasa, et al. Alternatively, the primer layer may be a conventional thermoplastic coating or a thermoset coating. An example of a thermoplastic coating is polyvinyl alcohol. Examples of thermoset coatings include polyester-melamine coatings, acrylic melamine coatings, epoxy coatings, and polyisocyanate coatings.

A primer layer may provide not only a desired surface resilience, but also may offer a means for controlling thickness of the support. By way of example only, a suitable overall thickness for the support is in the range of about 1 to about 3 mm.

An optional adhesion promotion layer may be inserted between a silicone top layer and the photosensitive layer. One suitable adhesion promotion layer comprises an aminosilane, such as γ-aminopropyltriethoxy silane and γ-[N-(2-aminoethyl)aminopropyl] trimethoxysilane.

An optional protective layer may be laminated on top of a silicone layer to protect the silicone surface during storage and handling. A suitable protective layer is a thin polymeric film including polyesters such as polyethylene terephthalate, polyolefins such as polyethylene and polypropylene, and the like. The protective layer is designed to be easily removed without damaging the silicone layer surface either prior to or during processing.

By way of example only, the following waterless printing plate precursors are suitable as the lithographic printing plate precursor in the practice of the present invention: PEARLdry plates from Presstek, Inc. (Hudson, N.H.); SCORPION thermal waterless printing plates from Kodak Polychrome Graphics (Norwalk, Conn.); TAN negative-working waterless plates and TAP positive-working waterless plates from Toray Industries (New York, N.Y.).

By the step of imaging, the lithographic printing plate precursor is converted to a lithographic printing plate having ink-receptive image areas and ink-repellent non-image areas. By "ink-receptive," it is meant that the image areas will pick up a printing ink, either from a fount solution or from a waterless ink composition, during the printing process. In contrast, "ink-repellent" means that the non-image areas will not pick up the printing ink from a fount solution (in the case of a wet lithographic printing plate) or a waterless ink composition (in the case of a waterless lithographic printing plate).

One suitable method for imaging the lithographic printing plate precursor includes imagewise exposure to radiation. For imagewise exposure, a portion of the imageable coating is exposed to radiation to which the imageable coating is sensitive. The exposed portion becomes either more soluble or less soluble in a developer than an unexposed portion of the coating. The exposed portion corresponds to either image areas or non-image areas, the image areas and non-image areas together defining an image that is to be transcribed onto the lithographic printing plate precursor.

Imagewise exposure may be done by various methods common in the field, including analog and digital methods. Analog methods include techniques such as flood exposure to actinic radiation through an image-bearing separation transparency (e.g., a photographic negative). Alternatively, imagewise exposure may be accomplished by a digital method with computer control by rasterizing a laser across the imageable coating, and activating the laser beam at areas of the imageable coating that are to be exposed. In digital methods, the exposed and unexposed areas are determined by correspondence to a digital image that is generally stored on the controlling computer.

The step of imaging may further include the step of developing. The step of developing may include washing the lithographic printing plate, after imagewise exposure, in a suitable developer solution to remove either exposed portions or unexposed portions of the imageable coating. The step of developing generally exposes the hydrophilic surface underlying the imageable coating in non-image areas, for a wet printing plate; alternatively, the step of developing may expose an oleophilic surface underlying an imageable coating for a waterless printing plate. The choice of developer solution is generally determined by the nature of the imageable coating. Suitable developer solutions are well-known in the field of lithographic printing plates. Both organic-based and aqueous-based developers are available and suitable for the practice of the invention.

After the step of imaging, a lithographic printing plate is obtained. The lithographic printing plate has non-image areas in which an ink-repellent layer (which can be either hydrophilic or amphiphobic, depending on whether the plate is of the wet-type or waterless-type) is exposed, and image areas in which an ink-receptive coating persists. The ink-receptive image areas and ink-repellent non-image areas together define an image.

Applying a Curable Composition to Ink-receptive Image Areas

In another step of the method, a first curable composition is applied to the lithographic printing plate, to form a substantially uniform coating of the first curable composition on ink-receptive image areas.

Curable Compositions

Many curable compositions may be employed as the curable composition in the practice of the method. The phrase "curable composition" is used herein to mean a composition that can undergo a curing reaction initiated by heat or radiation, whereby the composition is transformed from an uncured state in which the composition is flowable and coatable, to a cured state in which the composition is at least partially hardened and flows less readily than in the uncured state. In general, a curable composition will include as one component at least one crosslinkable monomer or crosslinkable prepolymer, and the curing reaction will involve irreversible crosslinking of the crosslinkable monomer or prepolymer to make a cured material. As described below, the crosslinkable monomer or crosslinkable prepolymer may comprise, for example, an epoxide functional group or an ethylenically unsaturated functional group. A curable composition may also include other components such as a polymerization initiator, a binder, etc. Curable compositions in the practice of the invention may suitably be those that are curable or polymerizable by a free radical mechanism or those that are curable by a cationic mechanism, for example.

In general, the curable composition will be in a coatable liquid form when applied. The curable composition may, however, be solid or highly viscous at room temperature and become less viscous or liquid at elevated temperatures. Therefore, it may be necessary to heat the curable composition to achieve an appropriate viscosity before applying to the lithographic printing plate.

In order to avoid leaving the curable composition on ink-repellent non-image areas, it is desired that the curable composition have a relatively high viscosity when applied to the lithographic printing plate. The curable composition may suitably have a viscosity greater than about 100 cP in some embodiments, and may have a viscosity greater than about 500 cP in other embodiments.

Viscosity of the curable composition can be modified or increased by using reactive monomers or prepolymers having high molecular weights, or by adding polymeric binders of high molecular weight. Polymeric binders can also be employed in the curable composition to achieve other desired properties of the curable composition or for the resulting cured material. Suitable polymeric binders include polyvinyl pyrrolidone or derivatives, such as those described in U.S. Pat. No. 5,362,605 to Mirle, et al.; graft polymers, such as those described in U.S. Pat. No. 5,204,222 to Gersdorf, et al.; block copolymer binders, such as those described in U.S. Pat. No. 6,017,678 to Gries, et al.; diene copolymers, such as those described in U.S. Pat. No. 5,281,510 to Sakurai, et al.; ionic polymer complexes, such as those described in U.S. Pat. No. 6,159,658 to Tanaka, et al.; polyamides, such as those described in U.S. Pat. No. 3,512,971 to Floss, et al.; maleic copolymers, such as those described in U.S. Pat. No. 5,859,134 to Reimers. A binder may suitably be included in the curable composition at a level up to 70 wt.-% of the curable composition. The quantity of binder that should be included in the curable composition depends on a number of factors, including the molecular weight of the chosen binder and other parameters that dictate the effectiveness of controlling the viscosity of the curable composition.

Another method of increasing viscosity of the curable composition is to add a gelling agent. Gelling agents are typically capable of forming reversible links, such as for example hydrogen bonds or ionic bonds, with other components in the curable composition. Suitable gelling agents are reported, for example, in U.S. Pat. Nos. 4,889,793 and 4,927,739 to Taniguchi, et al. Representative gelling agents include polyamides, polyesteramides, N-acyl amino acid derivatives and the like. Complexing polymers reported in U.S. Pat. No. 5,362,605 to Mirle, et al., such as polyvinylpyrrolidone polymers and copolymers having molecular weight of 5 kDa to 100 kDa, may also suitably function as gelling agents.

A suitable curable composition will wet ink-receptive image areas and should not wet ink-repellent non-image areas of the lithographic printing plate. The term "wet" is used to indicate that the composition has relatively greater affinity for contact with the image areas than for contact with non-image areas, and will therefore preferentially coat the image areas.

Furthermore, the cured material obtained after a subsequent curing step described below should act as an ink-receptive material. In other words, upon curing of the curable composition, the ink-receptive image areas that are coated by the curable composition should become ink-receptive cured areas.

It is desirable that, after curing, the ink-receptive cured areas have good resistance to organic solvents such as alcoholic solvents typically used in flexographic printing inks and plate cleaners. Therefore, components of the curable composition should be chosen to provide this property in the cured material. Commonly used alcoholic solvents are ethanol, 2-propanol, n-butanol, and n-propanol. Resistance to such solvents can be achieved by adequate crosslinking in the cured materials, and selections of monomers and binders for the curable composition that are incompatible with alcoholic solvents.

The curable compositions of the present invention may be those curable or polymerizable by free-radical mechanisms. Such free-radical curable compositions typically contain a monomer or prepolymer component having a plurality of ethylenically unsaturated bonds available for crosslinking during a curing reaction. In the presence of free radicals, these unsaturated bonds quickly react with each other to form a three-dimensional network and thereby transform the curable composition into a cured material. By way of example, the unsaturated component may comprise methacrylate, acrylate or styrene. Ethylenically unsaturated components are well-known in the field of curable coatings for printing plates.

Free radicals can be generated to initiate curing by exposure of the curable composition to an energy source, oftentimes actinic radiation such as ultraviolet (UV) radiation, heat, or an electron beam. To enhance efficiency of free-radical generation, a free-radical initiator is generally included in the curable composition. The initiator is usually added in an amount ranging from 0.01 to 5% by weight of the total curable composition. Choice of free-radical initiators depends on the type of energy source to be applied during curing. Free-radical initiators are also well-known in the field of curable coatings for printing plates.

UV radiation is most commonly used energy source for curing. When such UV radiation is used, suitable initiators include the benzoin alkyl ethers, such as benzoin methyl ether, benzoin ethyl ether, benzoin isopropyl ether and benzoin isobutyl ether. Another class of initiators are the dialkoxyacetophenones exemplifed by 2,2-dimethoxy-2-phenylacetophenone (available under the trade name IRGACURE 651 from Ciba-Geigy Corporation, Tarrytown, N.Y.) and 2,2-diethoxy-2-phenylacetophenone. Still another class of initiators are the aldehyde and ketone carbonyl compounds having at least one aromatic nucleus attached directly to the carboxyl group. These initiators include, but are not limited to benzophenone, acetophenone, o-methoxybenzophenone, acetonaphthalene-quinone, methyl ethyl ketone, valerophenone, hexanophenone, alpha-phenyl-butyrophenone, p-morpholinopropiophenone, dibenzosuberone, 4-morphohnobenzophenone, 4'-morpholinodeoxybenzoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthlenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracen-7-one, 1-naphthaldehyde, 4,4'-bis(dimethylamino)-benzophenone, fluorene-9-one, 1'-acetonaphthone, 2'-acetonaphthone, 2,3-butadione, acetonaphthene, benz[a]anthracene 7.12 diene, etc. Phosphines such as triphenylphosphine and tri-o-tolylphosphine are also operable herein as initiators.

Suitable curable compositions for the present invention also include compositions that are curable or polymerizable by cationic mechanisms. Compositions curable by cationic mechanisms typically comprise a cationic initiator, a source for generating active protons, and a component comprising a functional group that is crosslinkable by a cationic reaction. Electron beam-curable and UV-curable compositions are most common, but heat-curable compositions are also known.

The cationic initiators are compounds that liberate acidic species upon exposure to radiation. These acidic species then catalyze the crosslinking of the crosslinkable functional group. Typical initiators include onium salts such as sulfonium salts (e.g., triarylsulfonium salts), iodonium salts (e.g., diaryliodonium salts), and diazonium salts; and metallocenes. Alternatively, it is possible to thermally initiate curing through the use of onium or pyridinium salts that upon heating are known to afford cationic species capable of initiating a cationic cure.

The source for generating active protons may be, for example, an alcohol or polyol. The active protons facilitate the conversion of the initiator to a corresponding cationic species, which activates the cationic polymerization. The source for generating active protons may be, in some instances, a functional group (such as an —OH group) of the same component that provides the crosslinkable functional group.

The curable composition includes a component comprising a functional group that is crosslinkable by a cationic mechanism. The component is typically a polymerizable monomer or a polymerizable prepolymer. The crosslinkable functional group may be, for example, an epoxy or vinyl ether. The epoxide may be a cycloaliphatic epoxide, a glycidyl ester, glycidyl ether, or epoxidized alpha-olefin, for example. Other suitable components comprising a crosslinkable functional group include epoxidized diglycidyl ethers of bisphenol A, and novolac resins such as, for example, cresol epoxy novolac and phenol epoxy novolac. Suitable components may be obtained, for example, by epoxidation of polyhydric phenols such as bisphenol resins and novolac resins with epichlorohydrin, and compounds obtained by oxidation of linear olefin compounds and cyclic olefin compounds with peroxides.

The curable compositions suitable for the practice of the present invention may include compositions curable both by free radical and cationic means. Such "hybrid systems" are described, for example, in U.S. Pat. No. 6,413,697 to Melisaris, et al.

The curable compositions may optionally contain additives that change or enhance properties of the curable compositions or of the resulting cured material. Additives are known in the art for use in radiation-curable compositions, and may include, for example, polymerization inhibitors or stabilizers, antioxidants, antiozonants, and plasticizers.

To inhibit premature crosslinking during storage of the curable compositions of this invention, thermal polymerization inhibitors and stabilizers may be added. Such stabilizers are well known in the art, and include, but are not limited to, the following: hydroquinones such as hydroquinone monobenzyl ether, methyl hydroquinone, amyloxyhydroquinone, hydroquinone monopropyl ether; phenols, such as n-butylphenol, phenol, and phenolic-thio compounds; phenothiazine; phosphites; nitrobenzene; and mixtures thereof. Stabilizers may be included in an amount within the range from about 0.1% to about 3% by weight of the curable composition. These stabilizers are effective in preventing crosslinking of the curable composition during preparation, processing and storage.

The compositions may optionally contain up to about 30% by weight of an inert particulate filler. Such fillers include fine particulate material of inorganic material such as silica, magnesium carbonate, alumina, talc, clay, and titanium oxide. Such fillers may impart desirable properties to the curable compositions and reliefs on printing plates containing those compositions.

The compositions may optionally contain a plasticizer. Examples of suitable plasticizers include benzoates, phthalates, phosphates and sulfonamides.

Methods of Applying the Curable Composition

The step of applying the first curable composition may be performed by many application methods. The curable composition may be applied to the lithographic printing plate via the use of a suitable roller for carrying the curable composition, for example. Suitable rollers include rubber rollers with a flat surface and gravure rollers. Gravure rollers typically have recessed cells and are preferred for applying a uniform layer of the curable composition. Another suitable application method employs a Meyer bar or other wire-wound metering rod. The step of applying may also be performed using any conventional application methods, such as air doctor coating, blade coating, air knife coating, squeeze coating, reverse roll coating, transfer roll coating, gravure coating, kiss coating, cast coating, spray coating, dip coating, bar coating, extrusion coating, or die coating, for example.

Another suitable method of applying the curable composition onto the lithographic printing plate is by a screen printing method. In a screen printing method, a permeable sheet is placed in contact with the lithographic printing plate, and then the first curable composition is spread onto the permeable sheet by, for example, using a rubber roller. Once the curable composition has permeated the permeable sheet, the permeable sheet is then separated from the lithographic printing plate, leaving behind a substantially uniform coating of the curable composition on the ink-receptive image areas of the lithographic printing plate. (Optionally, the curable composition may be spread only onto the areas of the permeable sheet that cover ink-receptive image areas, to save material.) Suitable permeable sheets include those typically used in screen printing. Frames may optionally be used to support the permeable sheet with respect to the lithographic printing plate.

The curable composition may also be applied selectively to only ink-receptive image areas. A method of applying the curable composition selectively includes using an ink-jet printhead rasterized under computer control to dispense the curable composition only in ink-receptive image areas of the lithographic printing plate. Ink-jet printheads suitable for dispensing curable compositions include, for example, GALAXY and NOVA printheads available from Spectra, Inc. (Lebanon, N.H.).

The curable composition may be applied to any desirable thickness that may readily be cured during the curing step. A thickness of about 1 to about 10 microns, for example, is suitable.

The first curable composition is applied to form a substantially uniform coating of the first curable composition on ink-receptive image areas (i.e., individual halftone dots). By "substantially uniform," it is meant that the coating of the first curable composition should be of relatively even thickness and sufficiently free from defects (such as pinholes or voids) in the area to be coated so that the quality of an image will not be compromised. By way of example, the variation in the thickness of the layer would preferably be less than about 20% of the thickness of the layer, and more preferably the variation would be less than 10% of the thickness of the layer.

Before curing, it may be useful to heat the lithographic printing plate to level the coating of the curable composition on the ink-receptive image areas of the lithographic printing plate. Also, if the curable composition contains non-reactive volatile solvents, it is preferred to remove such volatile solvents by moderate heating, prior to curing.

Curing the Composition to Produce Ink-receptive Cured Areas

Once a substantially uniform coating of the first curable composition is formed in the ink-receptive image areas of the lithographic printing plate, the coating is cured to produce ink-receptive cured areas including a first cured layer. As used herein, the term "curing" means at least partially hardening the curable composition so that it flows less readily than in the uncured state. The ink-receptive cured areas and the ink-repellent non-image areas define the image that was imparted to the lithographic printing plate in the imaging step.

In the step of curing, an energy source, to which the curable composition is sensitive, is applied. The step of curing may be done by, for example, exposing the curable composition to UV radiation or to a beam of electrons. Alternatively, heat may be applied to initiate curing, for an appropriate curable composition. Methods of curing are well-known in the field of curable compositions.

After curing, it may be useful to clean the lithographic printing plate to remove any loose materials or debris on the ink-repellent non-image areas. Post-cure cleaning can be accomplished using a contact cleaning device such as a rotating brush such as is described in U.S. Pat. No. 5,148,746 to Fuller, et al., or by other suitable means.

The method may further include applying a second curable composition to ink-receptive cured areas, and curing the second curable composition to produce ink-receptive cured areas including a second cured layer. Any of the curable compositions described above may be useful as the second curable composition. The step of applying and the step of curing may be carried out as described above.

By using a second curable composition that differs from the first cured composition, cured layers having different properties may be made. For example, the first cured layer may be suited to adhere to the ink-receptive image areas of the printing plate, while the second cured layer may advantageously have better receptivity for a printing ink.

Alternatively, the second curable composition and the first curable composition may be identical. This embodiment may be useful, for example, in achieving layer-by-layer buildup of a relief image to produce a relief printing plate. The curable composition may be applied repeatedly and cured repeatedly, until a desired relief depth is attained.

The image areas of flexographic printing plates, in particular, require a certain range of surface hardness. Shore hardness is a commonly used measure for surface hardness for flexographic plates. Shore hardness may be measured with a durometer built according to standard test procedures as specified in ASTM D2240 00. For optimal durability as flexographic printing plates, the ink-receptive cured areas of the relief printing plates of the present invention have a type-A Shore hardness value in the range of 45 to 70.

FIGS. 1A through 1C represent the various steps of the method of the first embodiment, where a waterless lithographic printing plate precursor is used. Referring to FIG. 1A, an imaged lithographic printing plate 100 includes support 102 and imageable coating 103. On a major surface of printing plate 100 are ink-repellent non-image areas 104 and ink-receptive image area 106, which results from the imaging of the lithographic printing plate precursor. A substantially uniform coating 108 of a curable composition is formed on ink-receptive image area 106 in the applying step, as shown in FIG. 1B. Coating 108 is then cured in a curing step to produce an ink-receptive cured area having a first cured layer 110, as shown in FIG. 1C.

Second Embodiment

In a second embodiment, the invention provides a method for making a relief printing plate from an imageable lithographic printing plate precursor, the method comprising the steps of: a) imaging the lithographic printing plate precursor to produce a lithographic printing plate having ink-receptive image areas and ink-repellent non-image areas, the ink-receptive image areas and ink-repellent non-image areas defining an image; b) applying a first curable composition to the lithographic printing plate, wherein the first curable composition wets ink-receptive image areas and does not wet ink-repellent non-image areas, to form a substantially uniform coating of the first curable composition on ink-receptive image areas; c) curing the coating of the first curable composition to produce ink-receptive cured areas including a first cured layer, such that the ink-receptive cured areas and ink-repellent non-image areas define the image; d) applying either the first curable composition or a second curable composition to the lithographic printing plate, wherein the first or second curable composition wets ink-receptive cured areas and does not wet ink-repellent non-image areas, to form a substantially uniform coating of the first or second curable composition on ink-receptive cured areas; e) curing the coating of the first or second curable composition on the cured layer, such that the cured layer includes ink-receptive cured areas defining the image; and f) repeating steps d) and e) to attain a desired relief depth for the ink-receptive cured areas of the cured layer; to produce the relief printing plate having ink-receptive cured areas defining the image.

Steps a) through c) of the method may be performed as described above, using suitable materials as described above. Subsequently, either the first curable composition or a second curable composition is applied to the lithographic printing plate to form a substantially uniform coating of the first or second curable composition on ink-receptive cured areas. The first or second curable composition is selected to wet ink-receptive cured areas and not wet ink-repellent non-image areas. The curable composition may be applied to any desirable thickness that may readily be cured during a subsequent curing step. A thickness of about 1 to about 10 microns, for example, is suitable. In the practice of the method, the steps of applying a first or second curable composition may be applied by any suitable method such as those described above, including a "screen printing" technique.

By using a second curable composition that differs from the first cured composition, cured layers having different properties may be made. For example, the first cured layer may be suited to adhere to the ink-receptive image areas of the printing plate, while the second cured layer may advantageously have better receptivity for a printing ink.

Alternatively, the second curable composition and the first curable composition may be identical.

After applying either the first or second curable composition to form a substantially uniform coating on ink-receptive cured areas, the coating is cured to again produce a cured layer such that the cured layer includes ink-receptive cured areas. The ink-receptive cured areas define the image that was imparted to the lithographic printing plate in the imaging step. In the step of curing, an energy source, to which the curable composition is sensitive, is applied. The step of curing may be done by, for example, exposing the curable composition to UV radiation or to a beam of electrons. Alternatively, heat may be applied to initiate curing, for an appropriate curable composition. Methods of curing are well-known in the field of curable compositions.

In the practice of the method, steps d) and e) are repeated to attain a desired relief depth for the ink-receptive cured areas of the cured layer. For each iteration, the curable composition may be applied to any desirable thickness that may readily be cured during the curing step. A thickness of about 1 to about 10 microns, for example, is suitable. This embodiment may be useful, for example, in achieving layer-by-layer buildup of a relief image to produce a relief printing plate. Each iteration increases the relief depth by approximately the thickness of the coating that is applied. The method may be used to produce a relief printing plate having ink-receptive cured areas defining the image, and ink-repellent non-image areas. Steps d) and e) are repeated until a desired relief depth is attained for the ink-receptive cured areas.

Typical flexographic plates have a relief depth in the range 400 to 700 microns. Due to the ink-repelling nature of the non-image areas of the relief printing plates provided by the present invention, it is possible to reduce the relief depth below that of typical flexographic plates which often do not have ink-repellent non-image areas. The invention may be used to produce a relief printing plate having a relief depth in the range of about 50 to about 700 microns. A relief depth in the range of about 200 to about 500 microns will be suitable for many applications.

The thickness built in each application of the curable compositions depends on the rheology or viscosity of the curable compositions and application methods. Typically the layer thickness is in the range of 1 to 10 microns. Thus, to reach a relief depth of 400 microns, it may be necessary to build 40 to 400 layers by repeating steps d) and e) a suitable number of times.

For the practice of this embodiment, it may therefore be desirable to maintain a higher viscosity for the curable compositions, in order to increase the thickness added to the ink-receptive cured areas by each application of the curable compositions. Viscosity of the curable compositions may be changed or increased as described above. Another method of enhancing the rate of layer buildup is to include a particulate material in the curable compositions. Suitable particulate materials include those described above. Alternatively, the particulate material may be provided in the form of a microgel as described in U.S. Pat. No. 4,956,252 to Fryd, et al., U.S. Pat. No. 4,957,850 to Kusuda, et al., or U.S. Pat. No. 5,707,773 to Grossman, et al; particulate polymers described by U.S. Pat. No. 5,736,298 to Koslijura, et al.; and latex particles as described in U.S. Pat. No. 5,902,714 to Reimers, or U.S. Pat. No. 6,210,854 to Grossman, et al. Particulate materials in the curable composition preferably have an average particle size in the range of about 0.5 to about 2 microns.

When the curable compositions are applied off-press, a suitable separating agent may be used to treat the plate before a subsequent application of a coating of a curable composition. Suitable separating agents include silicone fluids, for example. Use of such separating agents and related apparatus are described in U.S. Pat. No. 5,676,053 to Schafer.

After each curing step, it may be useful to clean the lithographic printing plate to remove any loose materials or debris on ink-repellent non-image areas. Post-cure cleaning can be accomplished using a contact cleaning device such as a rotating brush such as is described in U.S. Pat. No. 5,148,746 to Fuller, et al., or by other suitable means.

FIGS. 1A through 1E represent the various steps of the method of the second embodiment, where a waterless lithographic printing plate precursor is used. Referring to FIG. 1A, an imaged lithographic printing plate 100 includes horizontal support 102 and imageable coating 103. On a major surface of printing plate 100 are ink-repellent non-image areas 104 and ink-receptive image area 106, which results from the imaging of the lithographic printing plate precursor. A substantially uniform coating 108 of a first curable composition is formed on ink-receptive image area 106 in an applying step, as shown in FIG. 1B. Coating 108 is then cured in a curing step to produce an ink-receptive cured area having a first cured layer 110, as shown in FIG. 1C. A subsequent applying step is done using either the first curable composition or a second curable composition to form a substantially uniform coating 112 on the ink-receptive cured area 110, as shown in FIG. 1D. In a subsequent curing step, coating 112 is cured to form a second cured layer 114 on the first cured layer 110 of the ink-receptive cured area, as shown in FIG. 1E. The ink-receptive cured area now includes the first cured layer 110 and the second cured layer 114, and can be described by a relief depth 116, which is the vertical distance from the major surface of the ink-receptive cured area to the major surface of the adjacent ink-repellent non-image area. Steps d) and e) may be repeated to build up additional layers in a layer-by-layer fashion, to attain a desired relief depth for the ink-receptive cured area.

Figure 1:
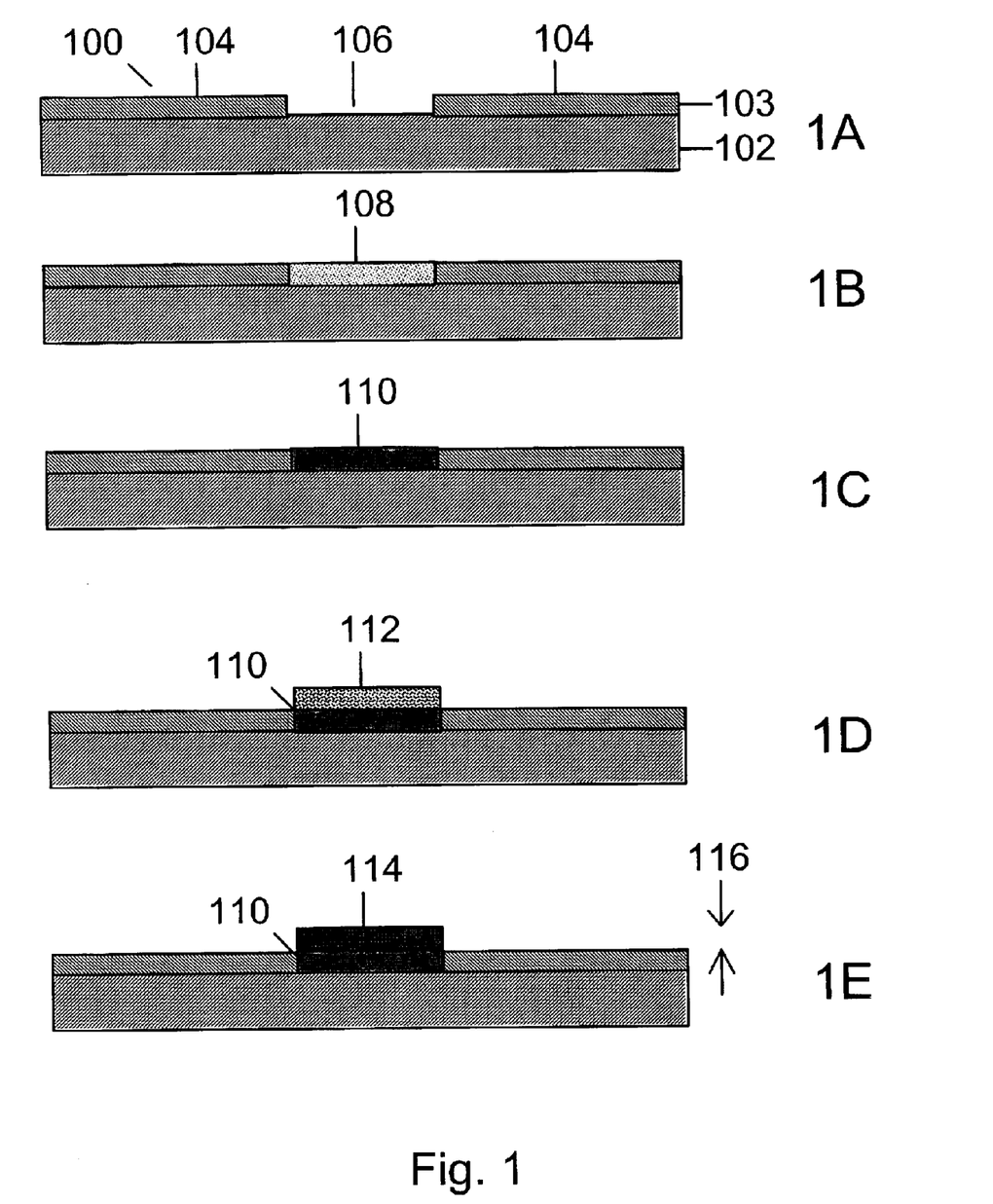
FIG. 1 represents a lithographic printing plate after various steps of the methods of the present invention.

The accompanying figures are for illustrative purposes only, and are not limiting. FIG. 1 illustrates the method using a lithographic printing plate having an image area 106 that is depressed relative to non-image area 104. However, the methods of the invention may be carried out using imaged lithographic printing plates having image areas and non-image areas in the same plane, or using imaged lithographic printing plates having image areas that protrude relative to non-image areas.

The second embodiment of the invention may be readily carried out in an automated fashion, such as by operating a rotary printing press adapted to carry out the steps of applying and curing the first or second curable compositions. The phrase "rotary printing press" is used herein to include printing presses having a plate cylinder, such as an offset printing press. The curable compositions may be applied to the imaged lithographic printing plate by use of the rotary printing press, where the lithographic printing plate is mounted on the plate cylinder, and the curable composition is charged in the ink tray of the rotary printing press. A uniform layer of the curable composition on the ink-receptive areas of the plate is obtained by running the press without feeding any paper. An energy source for curing may be mounted in appropriate relation to the plate cylinder so that the composition may subsequently be cured on the plate cylinder. The energy source may be activated either continuously or intermittently while the press is running. In the practice of this embodiment, it may be necessary to increase the gap between ink rollers and the plate cylinder and/or the gap between the plate cylinder and the blanket cylinder as the relief depth on the plate increases with the number of iterations.

Figure 2:
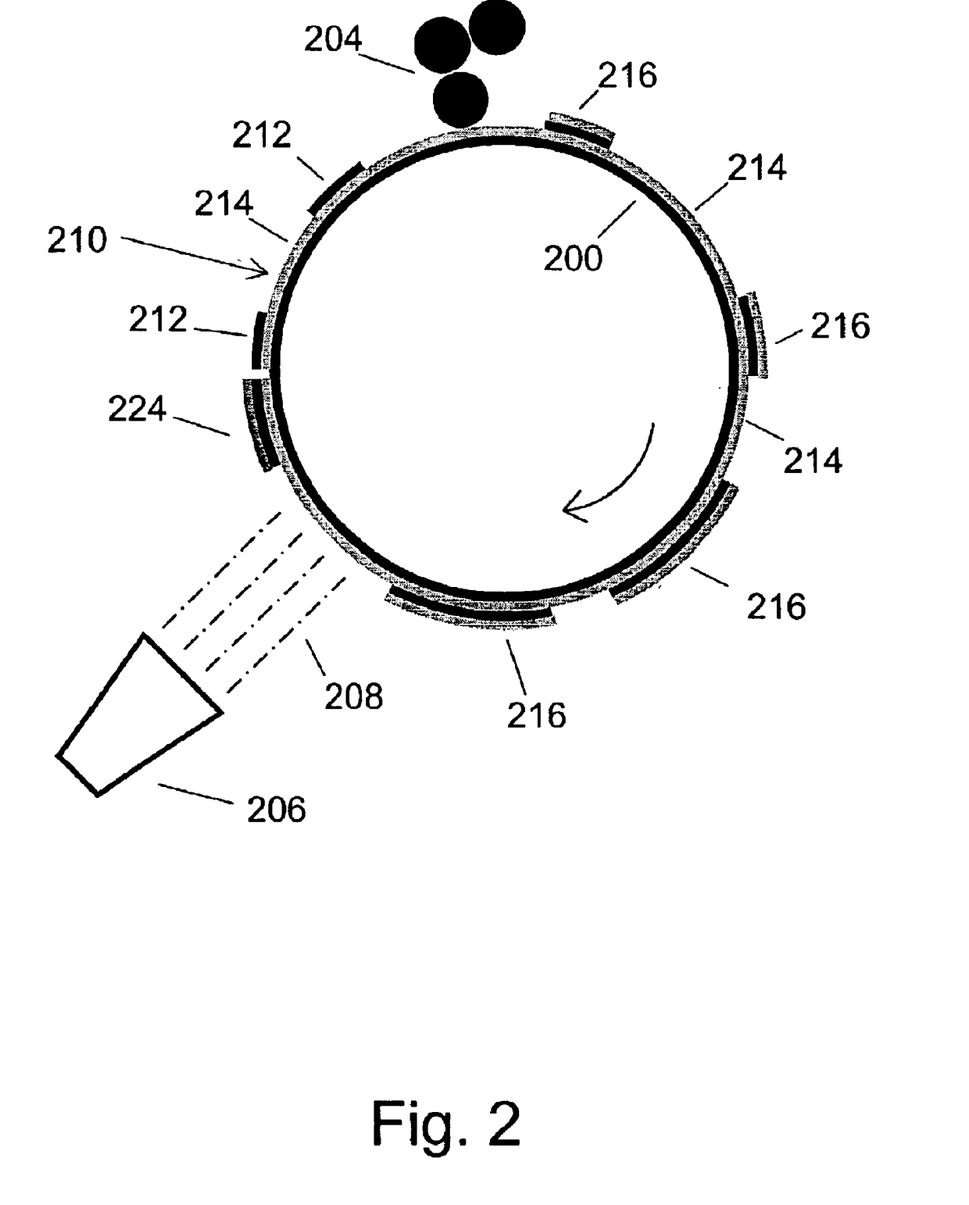
FIG. 2 shows a rotary printing press adapted for use in a method of the present invention.

FIG. 2 is a representation of a printing press adapted for the method. The printing press includes plate cylinder 200, inking roller assembly 204, and energy source 206. Onto plate cylinder 200 is mounted an imaged lithographic printing plate 210 having ink-receptive image areas 212 and ink-repellent non-image areas 214. As plate cylinder 200 rotates in the direction shown, a coating 216 of a curable composition is applied by inking roller assembly 204 to ink-receptive image areas 212. Coating 216 is subsequently exposed to radiation 208 from energy source 206, which initiates curing of the curable composition. Ink-receptive cured areas including a first cured layer 224 are formed, with ink-receptive cured areas defining the image of the lithographic printing plate. Several cured layers may be built up on the lithographic plate by continuing to operate the printing press. In this manner, a flexographic printing plate may be made from the imaged lithographic printing plate, the flexographic printing plate comprising the ink-receptive cured areas as its image areas.

Figure 3:
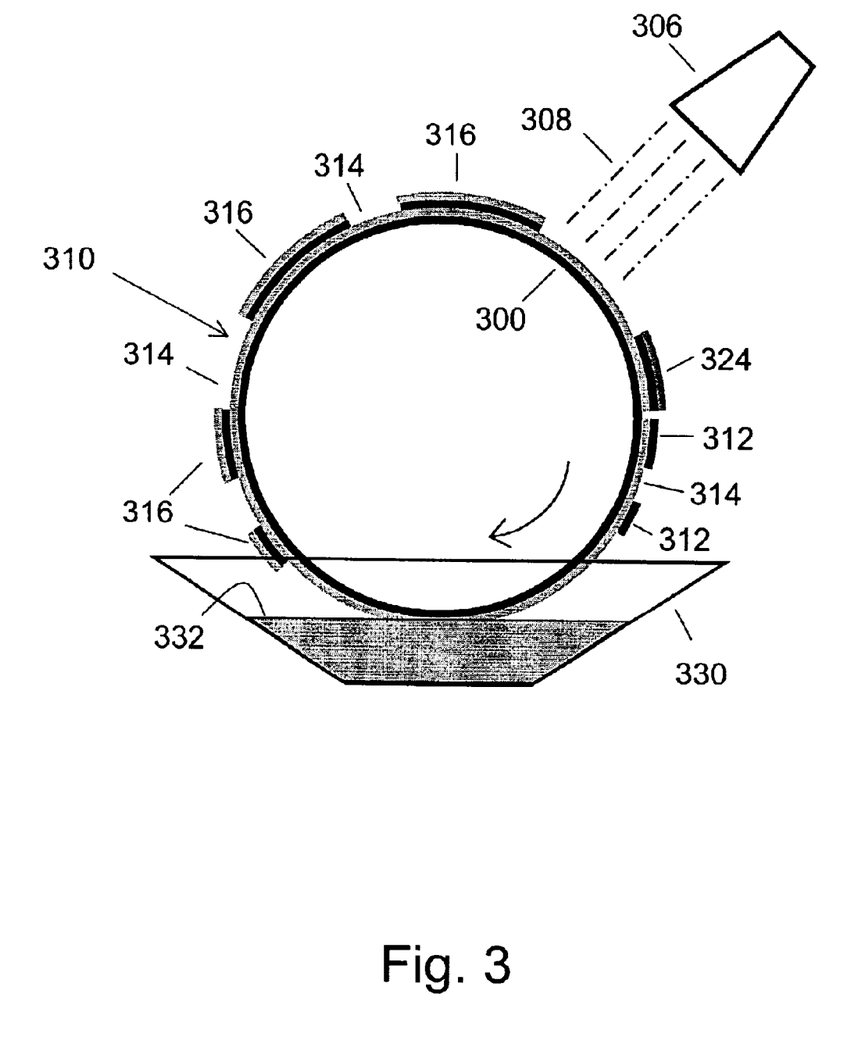
FIG. 3 shows another configuration for a printing press adapted for use in a method of the present invention.

FIG. 3 is a representation of another configuration for a printing press adapted for the method. The printing press includes plate cylinder 300, bath 330 of curable composition 332, and energy source 306. Onto plate cylinder 300 is mounted an imaged lithographic printing plate 310 having ink-receptive image areas 312 and ink-repellent non-image areas 314. As plate cylinder 300 rotates in the direction showing, a coating 316 of curable composition 332 is applied to ink-receptive image areas a 312 by dip-coating in bath 330. Coating 316 is subsequently exposed to radiation 308 from energy source 306, which initiates curing of the curable composition. Ink-receptive cured areas including a first cured layer 324 are formed, with ink-receptive cured areas defining the image of the lithographic printing plate. Several cured layers may be built up on the lithographic plate by continuing to operate the printing press. In this manner, a flexographic printing plate can be made from the imaged lithographic printing plate, the flexographic printing plate comprising the ink-receptive cure areas as its image areas.

The accompanying figures are for illustrative purposes only, and are not limiting. FIGS. 2 and 3 illustrate the method using a lithographic printing plate having an image area 212, 312 that protrudes relative to non-image area 214, 314. However, the methods of the invention may be carried out using imaged lithographic printing plates having image areas and non-image areas in the same plane, or using imaged lithographic printing plates having non-image areas that protrude relative to image areas (such as for some waterless plates).

The image areas of flexographic printing plates, in particular, require a certain range of surface hardness. Shore hardness is a commonly used measure for surface hardness for flexographic plates. Shore hardness may be measured with a durometer built according to standard test procedures as specified in ASTM D2240 00. For optimal durability as flexographic printing plates, the ink-receptive cured areas of the relief printing plates of the present invention have a type-A Shore hardness value in the range of 45 to 70.

It may also be desirable to coat the relief image with a suitable finish coat (also called a "capping layer" in the art of flexographic printing). The finish coat may provide properties such as increased surface hardness, better receptivity to a printing ink, enhanced ink transfer to the printing medium, or enhanced print quality.

This invention may take on various modifications and alterations without departing from the spirit and scope thereof. Accordingly, it is to be understood that this invention is not to be limited to the above-described, but it is to be controlled by the limitations set forth in the following claims and any equivalents thereof. It is also to be understood that this invention may be suitably practiced in the absence of any element not specifically disclosed herein.

In describing preferred embodiments of the invention, specific terminology is used for the sake of clarity. The invention, however, is not intended to be limited to the specific terms so selected, and it is to be understood that each term so selected includes all technical equivalents that operate similarly.

What is claimed is:

1. A method for making a relief printing plate from an imageable lithographic printing plate precursor, the method comprising the steps of:

imaging the lithographic printing plate precursor to produce a lithographic printing plate having ink-receptive image areas and ink-repellent non-image areas, the ink-repellent non-image areas having both hydrophobic and oleophobic character, the ink-receptive image areas and ink-repellent non-image areas defining an image;

applying a first curable composition to the lithographic printing plate, wherein the first curable composition wets ink-receptive image areas and does not wet ink-repellent non-image areas, to form a substantially uniform coating of the first curable composition on ink-receptive image areas; and curing the coating of the first curable composition to produce ink-receptive cured areas including a first cured layer, such that the ink-receptive cured areas and ink-repellent non-image areas define the image.

2. The method of claim 1 wherein the step of imaging the lithographic printing plate precursor includes imagewise exposing the printing plate precursor by a digital method.

3. The method of claim 1 wherein the step of imaging the lithographic printing plate precursor includes imagewise exposing the printing plate precursor by an analog method.

4. The method of claim 1 wherein the lithographic printing plate comprises a rubber substrate.

5. The method of claim 1 wherein the ink-repellent non-image areas comprise a silicone material.

6. The method of claim 1 wherein the ink-repellent non-image areas comprise a fluoropolymer material.

7. The method of claim 1 wherein the first curable composition comprises an ethylenically unsaturated polymerizable component.

8. The method of claim 1 wherein the first curable composition comprises a gelling agent to enhance the viscosity of the first curable composition.

9. The method of claim 1 wherein the step of applying a first curable composition includes heating the lithographic printing plate.

10. The method of claim 1 wherein the step of applying a first curable composition includes:

placing a permeable sheet in contact with the lithographic printing plate to cover ink-receptive image areas;

applying the first curable composition at least to areas of the permeable sheet that cover ink-receptive image areas; and separating the permeable sheet from the lithographic printing plate, to leave a substantially uniform coating of the first curable composition on ink-receptive image areas.

11. The method of claim 1 wherein the substantially uniform coating has a thickness in the range of about 1 to about 10 microns.

12. The method of claim 1 wherein the step of curing includes heating the imaged lithographic printing plate.

13. The method of claim 1 wherein the first curable composition includes an ultraviolet-sensitive component, and the step of curing includes exposing the coating of the first curable composition to ultraviolet radiation.

14. The method of claim 1 wherein the first curable composition includes a component that is curable by electron irradiation, and step of curing includes exposing the coating of the first curable composition to an electron beam.

15. The method of claim 1 further including:
   applying a second curable composition to the lithographic printing plate, wherein the second curable composition wets ink-receptive cured areas and does not wet ink-repellent non-image areas, to form a substantially uniform coating of the second curable composition on ink-receptive cured areas; and
   curing the coating of the second curable composition to produce ink-receptive
   cured areas including a second cured layer.

16. The method of claim 15 wherein the second curable composition and the first curable composition are identical.

17. The method of claim 15 wherein the step of applying a second curable composition includes:
   placing a permeable sheet in contact with the lithographic printing plate to cover ink-receptive cured areas;
   applying the second curable composition at least to areas of the permeable sheet that cover ink-receptive cured areas; and
   separating the permeable sheet from the lithographic printing plate, to leave a substantially uniform coating of the second curable composition on ink-receptive cured areas.

18. A method for making a relief printing plate from an imageable lithographic printing plate precursor, the method comprising the steps of:
   (a) imaging the lithographic printing plate precursor to produce a lithographic printing plate having ink-receptive image areas and ink-repellent non-image areas, the ink-receptive image areas and ink-repellent non-image areas defining an image;
   (b) applying a first curable composition to the lithographic printing plate, wherein the first curable composition wets ink-receptive image areas and does not wet ink-repellent non-image areas, to form a substantially uniform coating of the first curable composition on ink-receptive image areas;
   (c) curing the coating of the first curable composition to produce ink-receptive cured areas including a first cured layer, such that the ink-receptive cured areas and ink-repellent non-image areas define the image;
   (d) applying either the first curable composition or a second curable composition to the lithographic printing plate, wherein the first or second curable composition wets ink-receptive cured areas and does not wet ink-repellent non-image areas, to form a substantially uniform coating of the first or second curable composition on ink-receptive cured areas;
   (e) curing the coating of the first or second curable composition on the cured layer, such that the cured layer includes ink-receptive cured areas defining the image; and
   (f) repeating steps (d) and (e) to attain a desired relief depth for the ink-receptive cured areas of the cured layer;
   to produce the relief printing plate having ink-receptive cured areas defining the image.

19. The method of claim 18 wherein the step of imaging the lithographic printing plate precursor includes imagewise exposing the printing plate precursor by a digital method.

20. The method of claim 18 wherein the step of imaging the lithographic printing plate precursor includes imagewise exposing the printing plate precursor by an analog method.

21. The method of claim 18 wherein the lithographic printing plate comprises a rubber substrate.

22. The method of claim 18 wherein the ink-repellent non-image areas comprise a silicone material.

23. The method of claim 18 wherein the ink-repellent non-image areas comprise a fluoropolymer material.

24. The method of claim 18 wherein one of the first and second curable compositions comprises an ethylenically unsaturated polymerizable component.

25. The method of claim 18 wherein one of the first and second curable compositions comprises a gelling agent to enhance the viscosity of the first or second curable composition.

26. The method of claim 18 wherein one of the first and second curable compositions comprises a particulate material.

27. The method of claim 18 wherein step (b) or step (d) includes:
   placing a permeable sheet in contact with the lithographic printing plate to cover ink-receptive image areas or ink-receptive cured areas;
   applying the first or second curable composition at least to areas of the permeable sheet that cover ink-receptive image areas or ink-receptive cured areas; and
   separating the permeable sheet from the lithographic printing plate, to leave a substantially uniform coating of the first or second curable composition on ink-receptive image areas or ink-receptive cured areas.

28. The method of claim 18 wherein step (b) or step (d) includes heating the imaged lithographic printing plate.

29. The method of claim 18 wherein step (c) or step (e) includes heating the imaged lithographic printing plate.

30. The method of claim 18 wherein the substantially uniform coating of the first or second curable composition has a thickness in the range of about 1 to about 10 microns.

31. The method of claim 18 wherein one of the first and second curable compositions includes an ultraviolet-sensitive component, and step (c) or step (e) includes exposing the coating of the first or second curable composition to ultraviolet radiation.

32. The method of claim 18 wherein one of the first and second curable compositions includes a component that is curable by electron irradiation, and step (c) or step (e) includes exposing the coating of the first or second curable composition to an electron beam.

33. The method of claim 18 wherein the imaged lithographic printing plate is mounted on a cylinder of a rotary printing press, and wherein any of steps (b) through (f) includes operating the rotary printing press.

34. The method of claim 18 wherein the desired relief depth is in the range of about 50 to about 700 microns.

35. The method of claim 18 wherein the desired relief depth is in the range of about 200 to about 500 microns.

36. The method of claim 18 wherein the ink-receptive cured areas of the relief printing plate are characterized by a Shore A hardness in the range of about 45 to about 70.

37. The method of claim 18, further including the step of applying a separating agent to the ink-repellent areas so that the first or second curable composition does not wet ink-repellent non-image areas.

38. The method of claim 37 wherein the separating agent is a silicone fluid.

39. The method of claim 18, further including the step of applying a finish coat to the relief printing plate.

* * * * *